(12) United States Patent
Onic et al.

(10) Patent No.: US 12,135,389 B2
(45) Date of Patent: **\*Nov. 5, 2024**

(54) METHODS AND APPARATUSES FOR TESTING ONE OR MORE RECEPTION PATHS IN A RADAR RECEIVER

(71) Applicant: Infineon Technologies AG, Neubiberg (DE)

(72) Inventors: Alexander Onic, Linz (AT); Bernhard Gstoettenbauer, Engerwitzdorf (AT); Thomas Langschwert, Kirchheim (DE); Jochen O. Schrattenecker, Reichenthal (AT); Rainer Stuhlberger, Puchenau (AT)

(73) Assignee: Infineon Technologies AG, Neubiberg (DE)

( * ) Notice: Subject to any disclaimer, the term of this patent is extended or adjusted under 35 U.S.C. 154(b) by 327 days.

This patent is subject to a terminal disclaimer.

(21) Appl. No.: 17/560,366

(22) Filed: Dec. 23, 2021

(65) Prior Publication Data

US 2022/0113375 A1     Apr. 14, 2022

Related U.S. Application Data

(63) Continuation of application No. 16/285,863, filed on Feb. 26, 2019, now Pat. No. 11,269,055.

(30) Foreign Application Priority Data

Mar. 1, 2018   (DE) .......................... 102018104729.0

(51) Int. Cl.
*G01S 7/40*     (2006.01)
*G01R 31/28*    (2006.01)
(Continued)

(52) U.S. Cl.
CPC ........ *G01S 7/4021* (2013.01); *G01R 31/2822* (2013.01); *G01S 7/352* (2013.01);
(Continued)

(58) Field of Classification Search
CPC ........... G01S 7/4021; G01S 2007/4069; G01S 7/4056; G01S 7/352; G01S 7/4052;
(Continued)

(56) References Cited

U.S. PATENT DOCUMENTS 5,237,332 A     8/1993   Estrick et al.
6,725,018 B1 *  4/2004   Gross, Jr. ................ H04L 25/08
                                                          455/67.14
(Continued)

FOREIGN PATENT DOCUMENTS

CN    102362158 A    2/2012
CN    102906591 A    1/2013
(Continued)

OTHER PUBLICATIONS

Hong-Guang, Ma., et al., The GFRF Model of Receiver Intermediate Frequency Amplifier Based on Circuit Simulation, Journal of System Simulation, vol. 16(6), Jun. 2004, pp. 1143-1146.

*Primary Examiner* — Olumide Ajibade Akonai
(74) *Attorney, Agent, or Firm* — Harrity & Harrity, LLP

(57) ABSTRACT

A method for testing at least one reception path in a radar receiver is provided. The reception path contains a mixer and a downstream signal processing circuit. The method includes injecting a test signal into the radar reception path so that at least a first test tone having a first test tone frequency in a passband of the downstream signal processing circuit and a second test tone having a second test tone frequency outside the passband are present on the radar reception path downstream of the mixer; and determining a characteristic of the radar reception path based on a first
(Continued)

characteristic of a baseband signal at the first test tone frequency and a second characteristic of the baseband signal at the second test tone frequency.

17 Claims, 5 Drawing Sheets

(51) Int. Cl.
G01S 7/35 (2006.01)
G01S 13/34 (2006.01)

(52) U.S. Cl.
CPC .............. *G01S 13/34* (2013.01); *G01S 7/4056* (2013.01); *G01S 7/4069* (2021.05)

(58) Field of Classification Search
CPC .......... G01S 7/40; G01S 7/285; G01S 7/4069; G01S 13/34; H04B 17/0085; H04B 17/14; H04B 17/29; H04B 17/20; H04B 17/19; H04B 17/21; H04B 17/318; G01R 23/20

See application file for complete search history.

(56) References Cited

U.S. PATENT DOCUMENTS

| | | |
|---|---|---|
| 8,044,844 B2 | 10/2011 | Nyberg |
| 9,176,228 B2 | 11/2015 | Haberland et al. |
| 9,331,797 B2 | 5/2016 | Kordik et al. |
| 9,482,745 B2 | 11/2016 | Sickinger et al. |
| 9,696,359 B2 | 7/2017 | Subburaj et al. |
| 9,910,135 B2 | 3/2018 | Jenkins et al. |
| 10,057,795 B2 | 8/2018 | Starzer et al. |
| 10,234,542 B2 | 3/2019 | Subburaj et al. |
| 11,269,055 B2 | 3/2022 | Onic et al. |
| 2005/0260949 A1 | 11/2005 | Kiss et al. |
| 2008/0224921 A1* | 9/2008 | Walker .................... G01S 7/03 342/174 |
| 2012/0087451 A1 | 4/2012 | Razzell |
| 2014/0250969 A1 | 9/2014 | Alagarsamy et al. |
| 2014/0269972 A1 | 9/2014 | Rada et al. |
| 2015/0180590 A1 | 6/2015 | Wagner et al. |
| 2016/0077196 A1 | 3/2016 | Dehlink et al. |
| 2016/0204881 A1 | 7/2016 | Chung et al. |
| 2016/0327422 A1 | 11/2016 | Gluth et al. |
| 2017/0201019 A1 | 7/2017 | Trotta |
| 2018/0152254 A1 | 5/2018 | Vaucher et al. |
| 2018/0278344 A1 | 9/2018 | Freiberger |

FOREIGN PATENT DOCUMENTS

| | | |
|---|---|---|
| CN | 103502838 A | 1/2014 |
| CN | 104345304 A | 2/2015 |
| CN | 105450244 A | 3/2016 |
| CN | 105829910 A | 8/2016 |
| CN | 107037282 A | 8/2017 |
| CN | 107110902 A | 8/2017 |
| CN | 107462874 A | 12/2017 |
| DE | 19744736 C1 | 4/1999 |
| DE | 102015115017 A1 | 3/2016 |

* cited by examiner

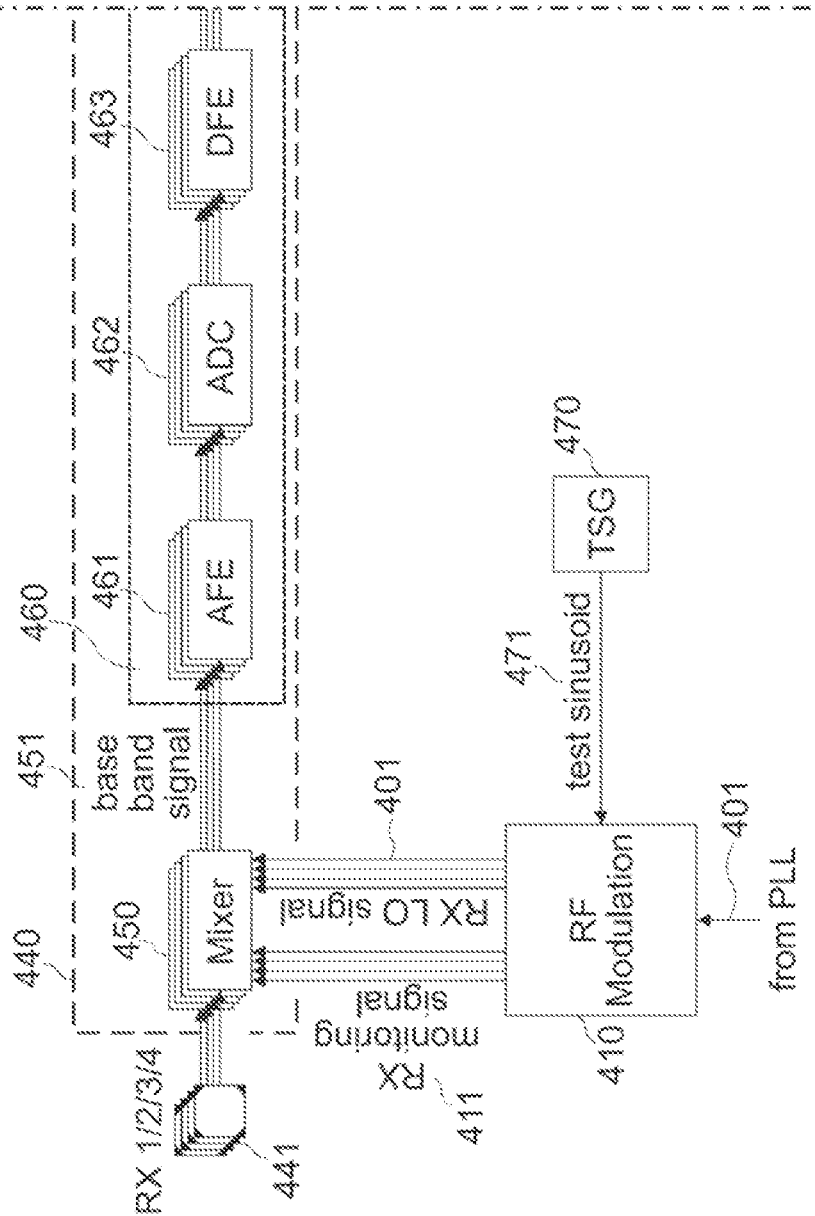

METHODS AND APPARATUSES FOR TESTING ONE OR MORE RECEPTION PATHS IN A RADAR RECEIVER

CROSS-REFERENCE TO RELATED APPLICATIONS

This application is a continuation of U.S. patent application Ser. No. 16/285,863 filed Feb. 26, 2019, which claims the benefit of German Patent Application No. 102018104729.0 filed Mar. 1, 2018, which are incorporated by reference as if fully set forth.

FIELD

Exemplary embodiments are concerned with checking the functionality of radar receivers. In particular, exemplary embodiments are concerned with methods and apparatuses for testing one or more reception paths in a radar receiver.

BACKGROUND

The behavior and/or configuration of single or multiple reception chains of a radar receiver can be of interest or require monitoring.

SUMMARY

There is therefore a need to provide a technology for monitoring radar receivers.

The need can be covered by the subject matter of the patent claims.

A first exemplary embodiment relates to a method for testing at least one reception path in a radar receiver. The reception path includes a mixer and a downstream signal processing circuit. The method includes injecting a test signal into the reception path, so that at least a first test tone having a frequency in a passband of the signal processing circuit and a second test tone having a frequency outside the passband are present on the reception path downstream of the mixer. Further, the method includes tapping off a baseband signal, generated by the signal processing circuit, from the reception path, the baseband signal being based on the test signal.

In some exemplary embodiments, the method further includes generating the test signal by mixing the first test tone and the second test tone with an oscillation signal for the mixer. The injecting of the test signal into the reception path in this case includes applying the test signal to a signal input of the mixer.

According to some exemplary embodiments, the test signal includes the first test tone and the second test tone, wherein the injecting of the test signal into the reception path is effected downstream of the mixer.

In some exemplary embodiments, the method further includes determining a first characteristic of the baseband signal at the frequency of the first test tone and determining a second characteristic of the baseband signal at the frequency of the second test tone. Furthermore, the method then includes determining a characteristic of the reception path based on the first characteristic of the baseband signal and the second characteristic of the baseband signal.

According to some exemplary embodiments, the test signal has a discontinuous frequency spectrum, wherein a bandwidth of the first test tone is smaller than a bandwidth of the passband.

In some exemplary embodiments, the frequency of the second test tone is chosen such that a characteristic that can be expected for the baseband signal at the frequency of the second test tone according to a transfer function of the signal processing circuit is in a predetermined range.

According to some exemplary embodiments, the frequency of the second test tone corresponds to a prescribed cutoff frequency from which there is provision to attenuate signal components in the baseband signal by a predetermined attenuation in comparison with the passband.

In some exemplary embodiments, the frequency of the first test tone corresponds to an envisaged cutoff frequency of the passband.

A second exemplary embodiment relates to a method for testing at least two reception paths in a radar receiver. The two reception paths in this case each include a mixer and a downstream signal processing circuit. The method includes respectively injecting a test signal into the two reception paths, so that in each case at least a first test tone and a second test tone having frequencies in a passband of the signal processing circuits are present on the two reception paths downstream of the respective mixer. Further, the method includes tapping off a first baseband signal, generated by its signal processing circuit, from one of the two reception paths, the first baseband signal being based on the test signal. The method furthermore includes tapping off a second baseband signal, generated by its signal processing circuit, from the other of the two reception paths, the second baseband signal being based on the test signal.

According to some exemplary embodiments, the first baseband signal and the second baseband signal are tapped off at the same time. The method in this case further includes determining a first phase of the baseband signal at the frequency of the first test tone and a second phase of the first baseband signal at the frequency of the second test tone and also determining a first phase of the second baseband signal at the frequency of the first test tone and a second phase of the second baseband signal at the frequency of the second test tone. Also, the method includes determining a relative phase response between the two reception paths based on the first phase of the first baseband signal, the second phase of the first baseband signal, the first phase of the second baseband signal and the second phase of the second baseband signal.

In some exemplary embodiments, the method further includes determining a first amplitude of the first baseband signal at the frequency of the first test tone and a second amplitude of the first baseband signal at the frequency of the second test tone and also determining an absolute phase response of one of the two reception paths based on the first amplitude of the first baseband signal and the second amplitude of the first baseband signal. Alternatively or additionally, the method can include determining a first amplitude of the second baseband signal at the frequency of the first test tone and a second amplitude of the second baseband signal at the frequency of the second test tone and also determining the absolute phase response of the other of the two reception paths based on the first amplitude of the second baseband signal and the second amplitude of the second baseband signal.

According to some exemplary embodiments, the method further includes determining a first amplitude of the first baseband signal at the frequency of the first test tone and a second amplitude of the first baseband signal at the frequency of the second test tone and also determining a first amplitude of the second baseband signal at the frequency of the first test tone and a second amplitude of the second baseband signal at the frequency of the second test tone. Also, the method then includes determining a relative amplitude balance between the two reception paths based on the first amplitude of the first baseband signal, the second amplitude of the first baseband signal, the first amplitude of the second baseband signal and the second amplitude of the second baseband signal.

In some exemplary embodiments, the test signal has a discontinuity in the frequency spectrum between a first signal component, generating the first test tone, and a second signal component, generating the second test tone, of the test signal.

A third exemplary embodiment relates to an apparatus for testing at least one reception path in a radar receiver. The reception path in this case includes a mixer and a downstream signal processing circuit. The apparatus includes an injection circuit configured to inject a test signal into the reception path, so that at least a first test tone having a frequency in a passband of the signal processing circuit and a second test tone having a frequency outside the passband are present on the reception path downstream of the mixer. Further, the apparatus includes a tapping circuit configured to tap off a baseband signal, generated by the signal processing circuit, from the reception path, the baseband signal being based on the test signal.

According to some exemplary embodiments, the apparatus further includes an evaluation circuit configured to determine a first characteristic of the baseband signal at the frequency of the first test tone and a second characteristic of the baseband signal at the frequency of the second test tone. The evaluation circuit is furthermore configured to determine a characteristic of the reception path based on the first characteristic of the baseband signal and the second characteristic of the baseband signal.

In some exemplary embodiments, the apparatus and the radar receiver are arranged on a common semiconductor chip.

A fourth exemplary embodiment relates to an apparatus for testing at least two reception paths in a radar receiver. The two reception paths in this case each include a mixer and a downstream signal processing circuit. The apparatus includes an injection circuit configured to inject a respective test signal into the two reception paths, so that in each case at least a first test tone and a second test tone having frequencies in a passband of the signal processing circuits are present on the two reception paths downstream of the respective mixer. Further, the apparatus includes a tapping circuit configured to tap off a first baseband signal, generated by its signal processing circuit, from one of the two reception paths and a second baseband signal, generated by its signal processing circuit, from the other of the two reception paths. The first baseband signal and the second baseband signal are each based on the test signal.

According to some exemplary embodiments, the apparatus further includes an evaluation circuit configured to determine a first phase of the first baseband signal at the frequency of the first test tone and a second phase of the first baseband signal at the frequency of the second test tone. Further, the evaluation circuit is configured to determine a first phase of the second baseband signal at the frequency of the first test tone and a second phase of the second baseband signal at the frequency of the second test tone. The evaluation circuit is furthermore configured to determine a relative phase response between the two reception paths based on the first phase of the first baseband signal, the second phase of the first baseband signal, the first phase of the second baseband signal and the second phase of the second baseband signal.

In some exemplary embodiments, the apparatus further includes an evaluation circuit configured to determine a first amplitude of the first baseband signal at the frequency of the first test tone and a second amplitude of the first baseband signal at the frequency of the second test tone. Further, the evaluation circuit is configured to determine a first amplitude of the second baseband signal at the frequency of the first test tone and a second amplitude of the second baseband signal at the frequency of the second test tone. The evaluation circuit is furthermore configured to determine a relative amplitude balance between the two reception paths based on the first amplitude of the first baseband signal, the second amplitude of the first baseband signal, the first amplitude of the second baseband signal and the second amplitude of the second baseband signal.

According to some exemplary embodiments, the apparatus and the radar receiver are arranged on a common semiconductor chip.

BRIEF DESCRIPTION OF THE DRAWINGS

Some examples of apparatuses and/or methods are explained in more detail below merely by way of example with reference to the accompanying figures, in which:

FIGS. 4-1 and 4-2 show an exemplary embodiment of an apparatus for testing one or more reception paths in a radar receiver.

DETAILED DESCRIPTION

Various examples are now described in greater detail with reference to the accompanying figures, which depict some examples. The thicknesses of lines, layers and/or areas in the figures may be exaggerated for clarity.

While further examples are suitable for various modifications and alternative forms, a few particular examples thereof are accordingly shown in the figures and are described in detail below. However, this detailed description does not restrict further examples to the particular forms described. Further examples can cover all modifications, counterparts and alternatives that fall within the scope of the disclosure. Identical reference signs refer throughout the description of the figures to identical or similar elements that can be implemented identically or in modified form in comparison with one another, while they provide the same or a similar function.

It is to be noted that if one element is referred to as "connected" or "coupled" to another element, the elements can be connected or coupled directly or via one or more intermediate elements. If two elements A and B are combined using an "or", this should be understood such that all possible combinations are disclosed, i.e. only A, only B, and A and B. An alternative wording for the same combinations is "at least one of A and B". The same applies to combinations of more than two elements.

The terminology used here to describe specific examples is not intended to have a limiting effect for further examples. When a singular form, e.g. "a, an" and "the", is used and the use of only a single element is defined neither explicitly nor implicitly as mandatory, further examples can also use plural elements in order to implement the same function. If a function is described below as implemented using a plurality of elements, further examples can implement the same function using a single element or a single processing entity. Furthermore, it goes without saying that the terms "comprises", "comprising", "has" and/or "having" in their usage specify the presence of the indicated features, integers, steps, operations, processes, elements, components and/or a group thereof, but do not exclude the presence or addition of one or more other features, integers, steps, operations, processes, elements, components and/or a group thereof.

Unless defined otherwise, all terms (including technical and scientific terms) are used here in their customary meaning in the field with which examples are associated.

Figure 1:
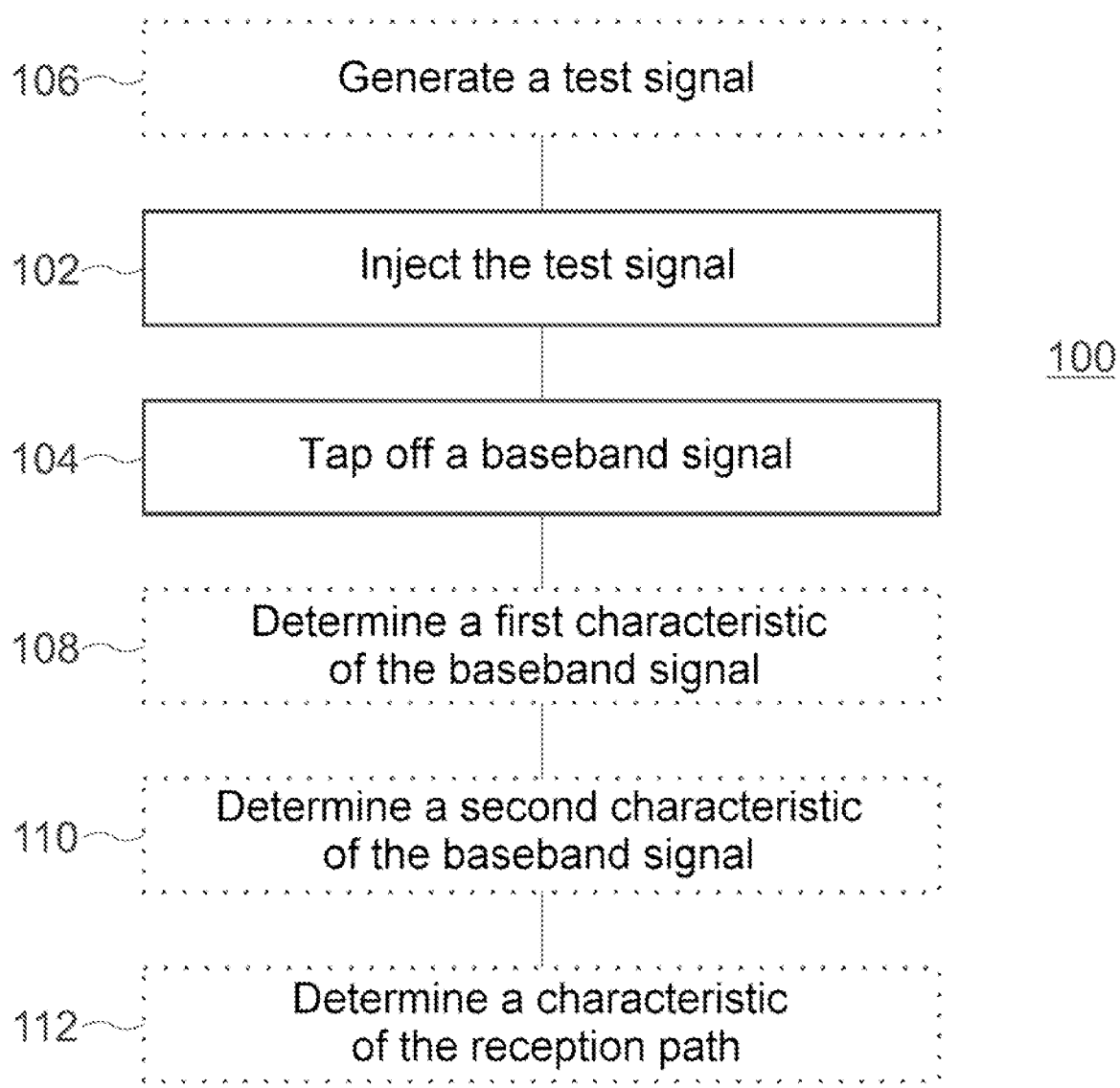
FIG. 1 shows a flowchart for an exemplary embodiment of a method for testing at least one reception path in a radar receiver.

FIG. 1 shows a flowchart for a method 100 for testing at least one reception path in a radar receiver.

The radar receiver is a receiver configured to receive radar signals. By way of example, the radar receiver can be configured to receive radar signals with a wavelength in the millimeter range (e.g. FMCW (Frequency Modulated Continuous Wave) radar signals having a frequency in a band from 76 to 81 GHz). The radar receiver can have one or more reception paths in order to down-convert one or more radio-frequency radar signals to baseband and process them further. To this end, the at least one reception path comprises a mixer and a downstream signal processing circuit. The mixer is designed to down-convert an applied radio-frequency signal to baseband by means of an oscillation signal. The downstream signal processing circuit is configured to process the signal output by the mixer further in the baseband frequency range. By way of example, the signal processing circuit can comprise one or more analog filters, one or more analog-to-digital converters (ADC), one or more digital filters, one or more decimation filters, one or more amplifiers, etc. Method 100 can enable the behavior or configuration of single or multiple instances of these assemblies to be tested.

To this end, method 100 comprises injecting 102 a test signal into the reception path, so that at least a first test tone (e.g. a first sinusoidal tone) having a frequency in a baseband passband of the signal processing circuit and a second test tone (e.g. a second sinusoidal tone) having a frequency outside the baseband passband are present on the reception path downstream of the mixer.

The first test tone and the second test tone are each tones having a predetermined, discrete frequency or predetermined, finite bandwidths. In other words: the first test tone and the second test tone are individual test tones that are separate or distinguishable from one another in the frequency spectrum. That is to say that the signal present on the reception path, which signal comprises the first test tone and the second test tone, has a discontinuity in the frequency spectrum between the first test tone and the second test tone. A discontinuity in the frequency spectrum of a signal is understood in the present application to be a range of the frequency spectrum that comprises one or more frequencies and in which the amplitude of the signal is substantially zero (but e.g. can still contain signal noise). Accordingly, the test signal has a discontinuity in the frequency spectrum between a first signal component, producing the first test tone, and a second signal component, producing the second test tone, of the test signal. The test signal therefore has a discontinuous frequency spectrum. Besides the first test tone and the second test tone, it is also possible for further discrete test tones to be applied to the reception path by the test signal.

The passband of the signal processing circuit is that frequency range within which the signal processing circuit allows the frequencies contained in an electrical signal to pass. The passband can be understood to be e.g. the frequency range in which the signal processing circuit attenuates the frequencies contained in an electrical signal by less than a prescribed value (e.g. 3 decibels). The passband is adjoined by a transition region that separates the passband from a stop band of the signal processing circuit. The stop band is that frequency range in which there is provision for frequencies contained in an electrical signal to be attenuated by a predetermined attenuation in comparison with the passband. The first test tone is within the passband, while the second test tone is outside the passband, i.e. is in the transition region or in the stop band of the signal processing circuit. The bandwidth of the first test tone is in this case smaller than the bandwidth of the passband based on the explanations above. generating 106 the test signal beforehand. By way of example, the test signal can be generated 106 by mixing the first test tone and the second test tone with an oscillation signal for the mixer in order to generate a test signal in the radar frequency range (e.g. in the range of 77 GHz) based on the first and the second test tone. Accordingly, the injecting 102 of the test signal into the reception path then comprises applying the test signal to a signal input of the mixer. The test signal is therefore generated such that the frequency of the oscillation signal used for down-conversion differs from the frequency or the frequencies of the test signal by the frequency of the respective test tones. For example, the following can apply: $f_{osc}=f_{test}-f_{ton}$, where $f_{osc}$ corresponds to the frequency of the oscillation signal, $f_{test}$ corresponds to a respective frequency of the test signal and $f_{ton}$ corresponds to the frequency of the respective test tone.

Alternatively, the generating 106 of the test signal can comprise mixing or combining two oscillation signals (e.g. two oscillation signals having frequencies in the gigahertz range). Similarly, the test signal can be generated 106 such that the test signal comprises the first test tone and the second test tone, i.e. e.g. at frequencies in baseband that are much lower than the radar frequency ranges. The test signal is then accordingly injected into the reception path downstream of the mixer.

Further, method 100 comprises tapping 104 a baseband signal generated by the signal processing circuit from the reception path, the baseband signal being based on the test signal. The tapped-off baseband signal can now be used to determine one or more characteristics of the reception path on the basis of the first and second test tones. The baseband signal can in this case be tapped off at any point in the reception path downstream of the mixer. The location at which the baseband signal is tapped off within the reception path can be chosen on the basis of the assembly (assemblies) of the reception path that is/are to be tested, for example. The baseband signal can be tapped off e.g. via a memory (e.g. a random access memory, RAM) that is coupled to the reception path and that stores the baseband signal.

Method 100 can further comprise determining 108 a first characteristic of the baseband signal at the frequency of the first test tone and determining 110 a second characteristic of the baseband signal at the frequency of the second test tone, for example. The first and the second characteristic of the baseband signal are the value of a variable characterizing or describing the baseband signal at the frequency of the respective test tone. By way of example, the first and/or the second characteristic can be an amplitude or a phase of the baseband signal at the frequency of the respective test tone. The determination of the characteristic of the baseband signal at the frequency of the test tones can comprise a Fourier analysis (e.g. a fast Fourier transformation—Fast Fourier Transform, FFT) of the baseband signal, for example. Method 100 can accordingly furthermore comprise determining a characteristic of the reception path based on the first characteristic of the baseband signal and the second characteristic of the baseband signal. The characteristic of the reception path is a property characterizing or describing the behavior of the reception path. By way of example, the first characteristic of the baseband signal and the second characteristic of the baseband signal can be taken as a basis for determining whether the reception path exhibits a desired or selected behavior or a selected configuration or a product requirement is observed.

Figure 3:
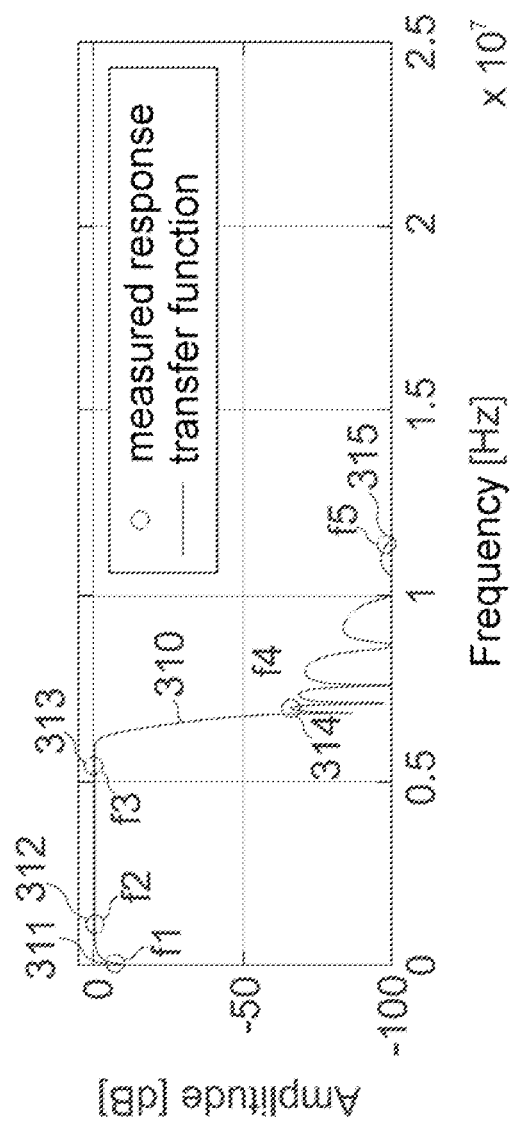
FIG. 3 shows an exemplary embodiment of a transfer function for a reception path.

Some exemplary characteristics of the reception path are explained in more detail below with reference to FIG. 3. FIG. 3 shows an exemplary transfer function 310 for a signal processing circuit in the range from 0 MHz to 25 MHz, indicating the expected amplitude profile of the baseband signal over the depicted frequency range. Further, actual (e.g. measured) amplitudes 311, . . . , 315 of the baseband signal are depicted in FIG. 3 for five test tones f1 to f5 applied to the reception path.

In the example shown in FIG. 3, it is assumed that the signal processing circuit comprises an analog high-pass filter, an analog low-pass filter, a digital low-pass filter and a decimation filter. However, it should be borne in mind that this configuration is chosen for purely pedagogic reasons and method 100 is not restricted to this specific signal processing circuit.

The test tone f1 is in the frequency range attenuated by the analog high-pass filter. The test tone f2 is in the passband of the signal processing circuit above the attenuated frequency range of the analog high-pass filter. The test tone f3 is at a boundary of the passband of the digital low-pass filter (and therefore of the passband of the signal processing circuit). The test tone f4 is at a boundary of the stop band of the digital low-pass filter (and therefore the stop band of the signal processing circuit). The test tone f5 is in the stop band of the signal processing circuit with a higher attenuation by the analog low-pass filter.

The evaluation of the actual amplitudes 311, . . . , 315 of the baseband signal after passing through the reception path at the frequencies of the test tones f1 to f5 allows characterization of the reception path. In this case, it is optionally also possible for the actual amplitudes 311, . . . , 315 to be normalized in respect of configured expectations (e.g. reception gain).

If e.g. the test tone f2 is chosen as a first test tone within the passband and the test tone f1 is chosen as a second test tone outside the passband of the signal processing circuit, it is possible to test whether the analog high-pass filter of the signal processing circuit is operating correctly. If the actual amplitude 311 of the baseband signal at the frequency of the second test tone f1 is attenuated in the range indicated by the transfer function 310 in FIG. 3, and if the actual amplitude 312 of the baseband signal at the frequency of the first test tone f2 is unattenuated, as indicated by the transfer function 310 in FIG. 3, it is possible to infer correct operation of the analog high pass filter. If the actual amplitude 311 of the baseband signal at the frequency of the second test tone f1 were unattenuated, for example, it would be possible to infer a malfunction in the analog high pass filter of the signal processing circuit.

If e.g. the test tone f3 is chosen as a first test tone within the passband and the test tone f4 is chosen as a second test tone outside the passband of the signal processing circuit, it is possible to test whether the digital low-pass filter is working correctly. If the actual amplitude 314 of the baseband signal at the frequency of the second test tone f4 is attenuated in the range indicated by the transfer function 310 in FIG. 3, and if the actual amplitude 313 of the baseband signal at the frequency of the first test tone f3 is unattenuated, as indicated by the transfer function 310 in FIG. 3, it is possible to infer correct operation of the digital low-pass filter. If an or the two actual amplitude(s) is/are not concordant with the transfer function 310, it is possible to infer a malfunction in the digital low-pass filter.

In the example above with the test tones f3 and f4, the frequency of the second test tone f4 corresponds to a prescribed cutoff frequency from which there is provision to attenuate signal components in the baseband signal by a predetermined attenuation in comparison with the passband, since the test tone f4 is at the boundary of the stop band of the digital low-pass filter. Also, the frequency of the first test tone f3 corresponds to the envisaged cutoff frequency of the passband. The test tones f3 and f4 can therefore be used to test whether the passband of the signal processing circuit ends at the envisaged cutoff frequency and the stop band of the signal processing circuit begins at the envisaged cutoff frequency.

The test tone f5 can e.g. furthermore be used to test whether the expected joint attenuation of the analog low-pass filter and the digital low-pass filter is observed. If the actual amplitude 315 of the baseband signal at the frequency of the test tone f5 is in the range indicated by the transfer function 310 in FIG. 3, it is possible to infer correct setting or operation of the analog low-pass filter.

For the test on the signal processing circuit by means of test tones outside the passband of the signal processing circuit, it is also advantageous to ensure that a characteristic to be measured (e.g. amplitude, phase) at the frequency used in the baseband signal of the signal processing circuit is also measurable or is in a range suitable for analyzing the characteristic. The frequency of the second test tone can thus e.g. be chosen such that a characteristic that can be expected for the baseband signal at the frequency of the second test tone based on a transfer function of the signal processing circuit is in a predetermined range. By way of example, the frequency of the second test tone can be chosen such that an amplitude of the baseband signal at the frequency of the second test tone is in a predetermined range (e.g. above a measurability limit).

The first test tone and the second test tone (and optionally also further test tones) can be injected at the same time, for example, and evaluated after a single measurement (for example by means of a subsequent FFT analysis). Alternatively, the reception path can also be tested using individual (i.e. single, chronologically successive) test tones and by means of multiple measurements.

Method 100 can therefore allow a test on one or more reception paths of a radar receiver using a small set of injected test tones.

Figure 2:
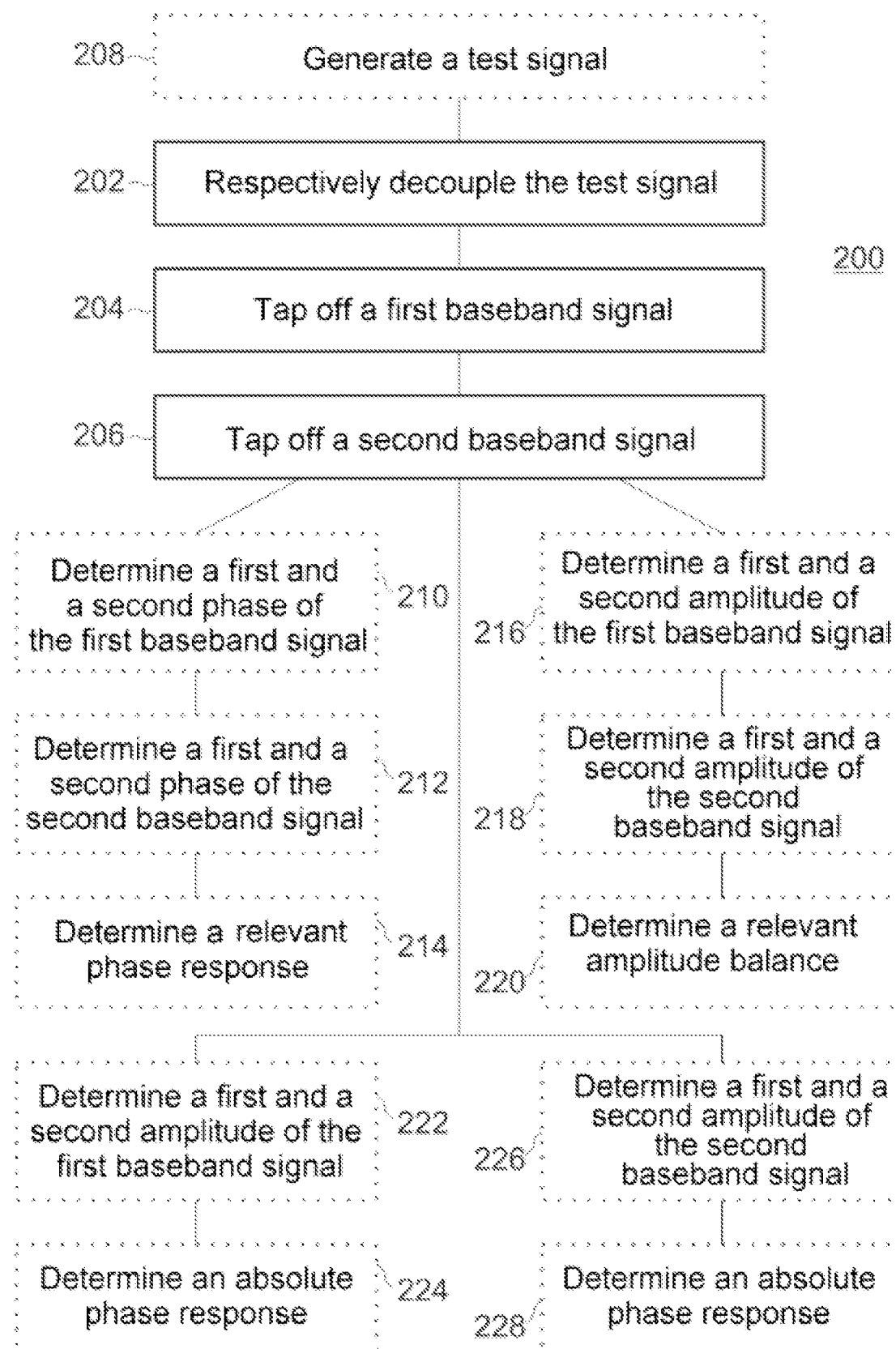
FIG. 2 shows a flowchart for an exemplary embodiment of a method for testing at least two reception paths in a radar receiver.

A flowchart for a method 200 for testing at least two reception paths in a radar receiver is shown in FIG. 2. The two reception paths furthermore each comprise a mixer and a downstream signal processing circuit.

Method 200 comprises respectively injecting 202 a test signal into the two reception paths, so that in each case at least a first test tone and a second test tone having frequencies in a passband of the signal processing circuits are present on the two reception paths downstream of the respective mixer. The method 202 therefore involves in each case two test tones being applied to the two reception paths, which are both in the passband of the signal processing circuits. In this case, it is assumed that the signal processing circuits have substantially the same passband.

Analogously to the principles described above for method 100, method 200 can also comprise generating 208 the test signal beforehand. The test signal in this case again has a discontinuity in the frequency spectrum between a first signal component, producing the first test tone, and a second signal component, producing the second test tone, of the test signal. Accordingly, the first test tone and the second test tone are again individual test tones that are separated or distinguishable from one another in the frequency spectrum. That is to say that the respective signals present on the reception paths, which signals comprise the first test tone and the second test tone, each have a discontinuity in the frequency spectrum between the first test tone and the second test tone.

Method 200 furthermore comprises tapping off 204 a first baseband signal generated by its signal processing circuit from one of the two reception paths. The first baseband signal in this case is based on the test signal. Further, method 200 comprises tapping off 206 a second baseband signal generated by its signal processing circuit from the other of the two reception paths. The second baseband signal is also based on the test signal. The tapped-off baseband signals can now be used to determine one or more characteristics of the individual reception paths and one or more characteristics of the reception paths relative to one another on the basis of the first and second test tones. The baseband signals can in this case again be tapped off 204 and 206 according to the principles described for method 100.

By way of example, the first baseband signal and the second baseband signal can be tapped off at the same time. Method 200 can in this case further comprise determining 210 a first phase of the first baseband signal at the frequency of the first test tone and a second phase of the first baseband signal at the frequency of the second test tone and also determining 212 a first phase of the second baseband signal at the frequency of the first test tone and a second phase of the second baseband signal at the frequency of the second test tone. Method 200 can then further comprise determining 214 a relative phase response between the two reception paths based on the first phase of the first baseband signal, the second phase of the first baseband signal, the first phase of the second baseband signal and the second phase of the second baseband signal.

Referring to the situation depicted in FIG. 3, it is possible e.g. for the test tone f2 to be chosen as a first test tone and the test tone f2 to be chosen as a second test tone. If the baseband signals of the reception paths are tapped off at the same time (e.g. recorded in a RAM), the relative phase response (relative phase difference) between the reception paths can be monitored based on the difference between the phase values determined for each of the reception paths.

The test tones f2 and f3 can e.g. also be used to test a relative amplitude balance between the two (or else further) reception paths. Method 200 then further comprises determining 216 a first amplitude of the first baseband signal at the frequency of the first test tone and a second amplitude of the first baseband signal at the frequency of the second test tone and also determining 218 a first amplitude of the second baseband signal at the frequency of the first test tone and a second amplitude of the second baseband signal at the frequency of the second test tone. Also, the method comprises determining 220 the relative amplitude balance between the two reception paths based on the first amplitude of the first baseband signal, the second amplitude of the first baseband signal, the first amplitude of the second baseband signal and the second amplitude of the second baseband signal. Referring to the situation in FIG. 3, it is possible e.g. to determine the amplitudes of the baseband signal at the frequencies of the test tones f2 and f3 for each reception path to be tested, in order to determine the relative amplitude balance between the respective reception paths therefrom. Method 200 can therefore be used to ensure that no reception path has deteriorated in comparison with the others.

In other words: the test tones in the passband can be used to determine or monitor relative characteristics between the respective reception paths.

The at least two test tones in the passband can alternatively be used to determine characteristics of the individual reception paths themselves.

Method 200 can e.g. further comprise determining 222 a first amplitude of the first baseband signal at the frequency of the first test tone and a second amplitude of the first baseband signal at the frequency of the second test tone and also determining 224 an absolute phase response of one of the two reception paths based on the first amplitude of the first baseband signal and the second amplitude of the first baseband signal. Alternatively or additionally, method 200 can comprise determining 226 a first amplitude of the second baseband signal at the frequency of the first test tone and a second amplitude of the second baseband signal at the frequency of the second test tone and also determining 228 the absolute phase response of the other of the two reception paths based on the first amplitude of the second baseband signal and the second amplitude of the second baseband signal. By way of example, it is to this end again possible to use the test tones f2 and f3 shown in FIG. 3.

By comparing the actual amplitudes 312 and 313 of the baseband signals at the frequencies of the test tones f2 and f3 with the transfer function 310, it is e.g. also possible to test whether the two reception paths each achieve their selected or configured gain.

The actual amplitudes 312 and 313 of the baseband signals at the frequencies of the test tones f2 and f3 can e.g. also be used to determine the signal-to-noise ratio (SNR) of the individual channels. In the frequency spectrum of the respective baseband signals, only peaks can be expected for the test tones f2 and f3, and otherwise noise. By comparing the powers at the frequencies of the test tones f2 and f3 with the noise power, it is possible to monitor the SNR and therefore e.g. to test whether a prescribed maximum SNR is exceeded or observed.

By testing the amplitudes of harmonics of the test tones f2 and f3, it is also possible to monitor linearity requirements on the reception paths.

Method 200 can therefore comprise determining a first characteristic of the first baseband signal at the frequency of the first test tone and a second characteristic of the first baseband signal at the frequency of the second test tone and also determining a characteristic of one of the two reception paths based on the first characteristic of the first baseband signal and the second characteristic of the first baseband signal. Alternatively or additionally, method 200 can comprise determining a first characteristic of the second baseband signal at the frequency of the first test tone and a second characteristic of the second baseband signal at the frequency of the second test tone and also determining a characteristic of the other of the two reception paths based on the first characteristic of the second baseband signal and the second characteristic of the second baseband signal.

Figures 2, 4:
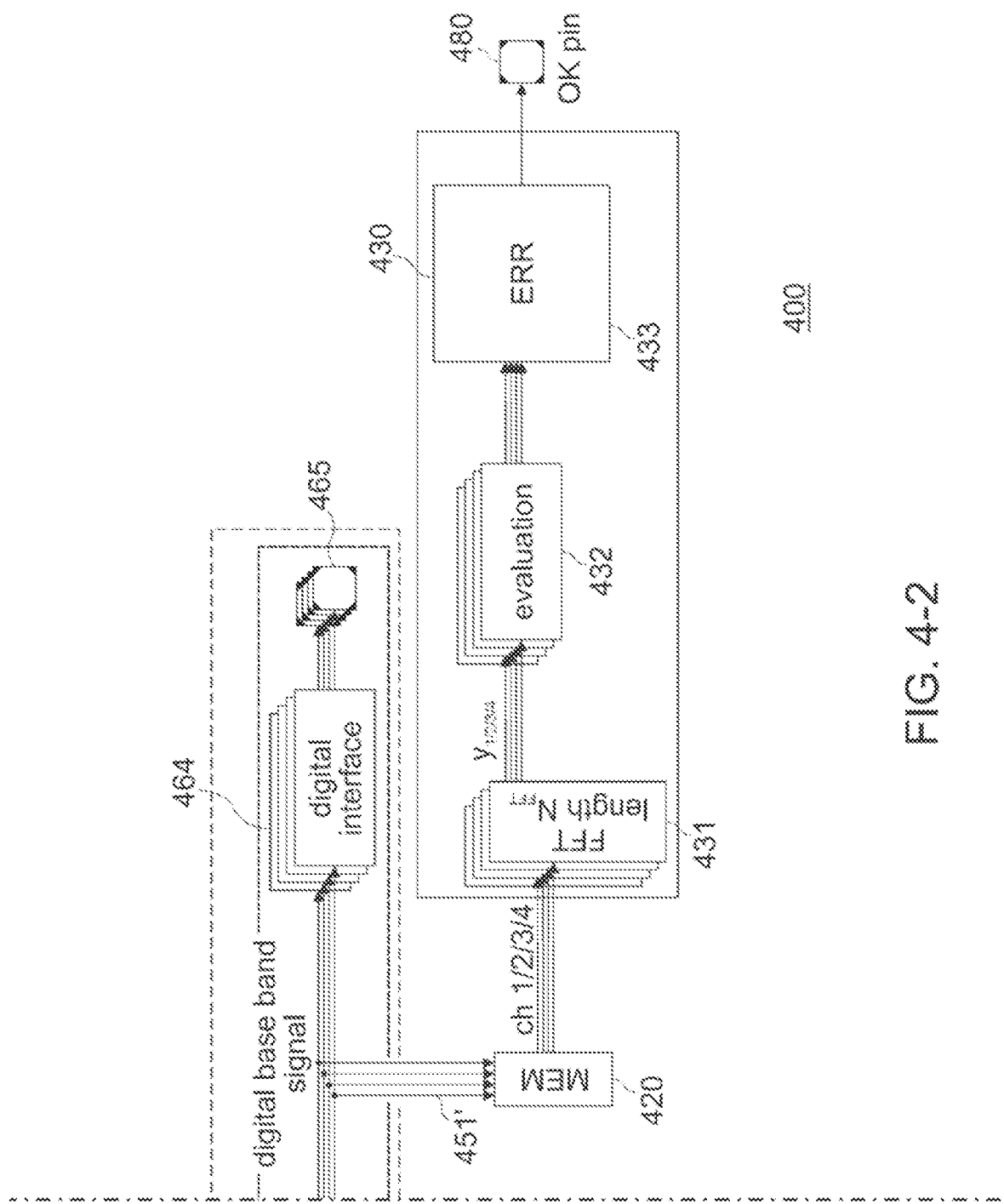

Finally, FIGS. 4-1 and 4-2 show an exemplary embodiment of an apparatus 400 for testing one or more reception paths of a radar receiver 440 according to the principles shown in connection with methods 100 and 200. Apparatus 400 and radar receiver 440 can be arranged e.g. on a common semiconductor chip. Alternatively, apparatus 400 and radar receiver 440 can also be arranged on different semiconductor chips intended to detect objects during regular radar operation.

The exemplary radar receiver 440 depicted in FIGS. 4-1 and 4-2 comprises four reception paths that down-convert radar signals provided by a signal source 441 (e.g. one or more reception antennas for radar signals) during normal operation to baseband in parallel and process them further. In this case, it should be borne in mind that radar receiver 400 can also comprise any other number of reception paths (e.g. one reception path or eight reception paths).

Each of the reception paths comprises a mixer 450 in order to down-convert radio-frequency signals that are present to baseband by means of an oscillation signal 401 (e.g. provided by a phase locked loop, PLL). Further, each of the reception paths comprises a signal processing circuit 460 connected downstream of the mixer. The exemplary signal processing circuit 460 depicted in FIGS. 4-1 and 4-2 comprises an analog front end 461 (e.g. one or more analog filters), an ADC 462, a digital front end 463 (e.g. one or more digital filters), a digital interface 464 (e.g. a low voltage differential signaling (LVDS interface) and a signal output 465. In this case, it should be borne in mind that signal processing circuit 460 can also comprise any other configuration with other, fewer or more assemblies.

Apparatus 400 comprises an injection circuit 410 configured to inject a test signal 411 into one or more of the reception paths.

If the aim is for the radar receiver 440 to be tested e.g. according to method 100, injection circuit 410 is configured to inject the test signal 411 into at least one reception path, so that at least a first test tone having a frequency in a passband of the signal processing circuit 460 and a second test tone having a frequency outside the passband are present on the reception path downstream of the mixer 450.

If the aim is for the radar receiver 440 to be tested e.g. according to method 200, injection circuit 410 is configured to inject in each case the test signal 411 into at least two of the reception paths, so that in each case at least a first test tone and a second test tone having frequencies in a passband of the signal processing circuits 460 are present on the two reception paths downstream of the respective mixer 450.

As indicated in FIGS. 4-1 and 4-2, the injection circuit 410 can be configured to generate test signal 411 by mixing a signal 471 containing the first test tone and the second test tone with the oscillation signal 401 for the mixer 450. The test tones can be e.g. sinusoidal tones that are output by a test tone generator 470. Accordingly, the injection circuit 410 is configured to inject the test signal 411 into the reception path 440 by applying the test signal 411 to a signal input of the mixer 450. Alternatively, the injection circuit 410 can e.g. also be configured to generate the test signal such that it comprises the first test tone and the second test tone. Accordingly, the injection circuit 410 can then be configured to inject the test signal into the reception path 440 downstream of the mixer 450. In other words: the test signal can be either a radio-frequency signal or a baseband signal.

Apparatus 400 also comprises a tapping-off circuit 420 configured to tap off a baseband signal 451 generated by the respective signal processing circuit from one or more of the reception paths.

If the aim is for the radar receiver 440 to be tested e.g. according to method 100, tapping-off circuit 420 is configured to tap off the baseband signal 451 generated by the signal processing circuit 460 in one of the reception paths from the reception path. The baseband signal 451 is based on the test signal 411 injected into the reception path.

If the aim is for the radar receiver 440 to be tested e.g. according to method 200, tapping-off circuit 420 is configured to tap off a first baseband signal generated by its signal processing circuit 460 from one of the at least two reception paths and to tap off a second baseband signal generated by its signal processing circuit 460 from the other of the at least two reception paths. The first baseband signal and the second baseband signal are each based on test signal 411.

The tapping-off circuit 420 can be e.g. in the form of a memory (e.g. RAM) that is coupled to one or more of the reception paths and in which the baseband signals of the respective reception paths are stored (e.g. streamed). By way of example, the baseband signals of the respective reception paths can be stored simultaneously. Each of the stored baseband signals can be stored e.g. with an accuracy of N=256 points.

Further, the apparatus 400 comprises an evaluation circuit 430 that takes the one or more tapped-off baseband signals as a basis for determining characteristics of the individual reception paths or characteristics between the individual reception paths. As indicated in FIGS. 4-1 and 4-2, the evaluation circuit 430 can be configured to output a particular characteristic to a monitoring output 480 of the apparatus 400. By way of example, the evaluation circuit 430 can be configured to output an error signal or a signal indicating correct operation to the monitoring output 480.

In order to be able to perform spectral analysis for the tapped-off baseband signals, the evaluation circuit 430 can comprise e.g. a Fourier transformation circuit 431 (e.g. for an FFT) that is configured to determine a frequency spectrum of the respective baseband signal. The recordings of the baseband signals can therefore have spectral analysis performed for them—e.g. by rating the amplitude and phase of multiple defined FFT coefficients. To this end, the evaluation circuit 430 can e.g. furthermore have a processing circuit 432 on which a COordinate Rotation DIgital Computer (CORDIC) algorithm runs. Both the Fourier transformation and the CORDIC algorithm can in this case be implemented as a piece of software running on a processor or as a dedicated circuit. The Fourier transformation circuit 431 or the processing circuit 432 can be part of the reception chain of the radar receiver, i.e. the Fourier transformation circuit 431 used for evaluating the test signal is used during regular operation, e.g. in order to produce a range-Doppler map for detecting objects. The use of discrete test tones in baseband therefore results in the synergistic advantage that the existing Fourier transformation circuit 431 of the radar receiver can be used for analyzing the discrete test tones, since these show themselves as discrete peaks after the Fourier transformation. The monitoring, i.e. the supply of the test signals, can be effected intermittently with the generation of regular radar signals for object detection. In other words: the supply between two measurements can achieve complete monitoring of the reception chain during regular radar operation.

An error handling circuit (error handler) 433 can be used to determine differences from prescribed configurations or failures of individual multiple assemblies in the reception paths. Error handling circuit 433 can e.g. output an error signal or a signal indicating correct operation to the monitoring output 480.

In respect of the analysis of the tapped-off baseband signals, reference should be made merely by way of example to some of the aspects already discussed in connection with the methods 100 and 200. It goes without saying that the evaluation circuit 430 can determine not only the analyses cited below but also further characteristics.

In line with method 100, evaluation circuit 430 can be configured for example to determine a first characteristic of the baseband signal 451 at the frequency of the first test tone and to determine a second characteristic of the baseband signal 451 at the frequency of the second test tone. Based on the first characteristic of the baseband signal and the second characteristic of the baseband signal, the evaluation circuit 430 can further be configured to determine a characteristic of the reception path.

In line with method 200, evaluation circuit 430 can be configured for example to determine a first phase of a first baseband signal (of a first reception path) at the frequency of the first test tone and a second phase of the first baseband signal at the frequency of the second test tone and to determine a first phase of a second baseband signal (of a second reception path) at the frequency of the first test tone and a second phase of the second baseband signal at the frequency of the second test tone. Based on the first phase of the first baseband signal, the second phase of the first baseband signal, the first phase of the second baseband signal and the second phase of the second baseband signal, the evaluation circuit 430 can further be configured to determine a relative phase response between the two reception paths.

Alternatively, in line with method 200, evaluation circuit 430 can be configured for example to determine a first amplitude of a first baseband signal (of a first reception path) at the frequency of the first test tone and a second amplitude of the first baseband signal at the frequency of the second test tone and to determine a first amplitude of a second baseband signal (of a second reception path) at the frequency of the first test tone and a second amplitude of the second baseband signal at the frequency of the second test tone. Based on the first amplitude of the first baseband signal, the second amplitude of the first baseband signal, the first amplitude of the second baseband signal and the second amplitude of the second baseband signal, the evaluation circuit 430 can further be configured to determine a relative amplitude balance between the two reception paths.

The monitoring quality can be dependent on the number of spectral points to be evaluated. As the description above has shown, some test tones can suffice for achieving monitoring aims for one or more reception paths of a radar receiver. According to the principles set out above, the test tones can e.g. all be injected at the same time and evaluated after a single measurement, or individual test tones evaluated in multiple measurements can be injected.

As the discussion above has shown, the proposed technique can be used e.g. to test the correct application of a configured gain in a reception path or of filter corner frequencies. Similarly, e.g. quality parameters having defined boundaries can be tested. Purely by way of example, reference should be made in this case to the SNR, the relative phase difference between reception paths, the relative amplitude balance between reception paths or the linearity of a reception path.

The proposed technique can be used to determine the reception characteristics of a system by means of the production of a minimum set of test tones. In other words: the proposed technique can allow fast and efficient monitoring of reception paths, since radar systems are linear and time-invariant and errors do not increase the complexity (e.g. a filter order). The less it is necessary to actively monitor something on a chip, the less excess power/heat it is necessary to compensate for on the chip by means of switched-off phases. It is therefore possible for more time to be used for active radar operation. The duty cycle of the radar system can therefore be positively influenced by the proposed technique. On the basis of the fast and efficient monitoring, the duty cycle of the radar can be increased.

The proposed technique can therefore allow reception path monitoring by means of individual injected sideband test tones.

The aspects and features described together with one or more of the examples and figures detailed above can also be combined with one or more of the other examples in order to replace an identical feature of the other example or in order to introduce the feature into the other example additionally.

The description and drawings present only the principles of the disclosure. Furthermore, all examples mentioned here are fundamentally intended to be used expressly only for teaching purposes, in order to assist the reader in understanding the principles of the disclosure and the concepts contributed by the inventor(s) for further development of the art. All statements herein regarding principles, aspects and examples of the disclosure and also concrete examples thereof are intended to encompass the counterparts thereof.

It goes without saying that the disclosure of multiple steps, processes, operations or functions disclosed in the description or the claims should not be interpreted as being in a specific order, unless explicitly or implicitly indicated otherwise, e.g. for technical reasons. The disclosure of multiple steps or functions thus does not limit them to a specific order, unless said steps or functions are not interchangeable for technical reasons. Further, in some examples, an individual step, function, process or operation can include multiple substeps, subfunctions, subprocesses or suboperations and/or can be subdivided into them. Such substeps may be included and be part of the disclosure of said individual step, provided that they are not explicitly excluded.

Furthermore, the claims that follow are hereby incorporated in the detailed description, where each claim may stand alone as a separate example. While each claim may stand alone as a separate example, it should be borne in mind that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A method for testing a radar reception path, wherein the radar reception path comprises a mixer and a downstream signal processing circuit, the method comprising:

injecting a test signal into the radar reception path so that at least a first test tone having a first test tone frequency in a passband of the downstream signal processing circuit and a second test tone having a second test tone frequency outside the passband are present on the radar reception path downstream of the mixer; and determining a characteristic of the radar reception path based on a first characteristic of a baseband signal at the first test tone frequency and a second characteristic of the baseband signal at the second test tone frequency.

2. The method as claimed in claim 1, further comprising: generating the test signal for the mixer by mixing the first test tone and the second test tone with an oscillation signal, wherein injecting of the test signal into the radar reception path comprises applying the test signal to a signal input of the mixer.

3. The method as claimed in claim 1, wherein injecting of the test signal into the radar reception path is effected downstream of the mixer.

4. The method as claimed in claim 1, further comprising: determining the first characteristic of the baseband signal at the first test tone frequency of the first test tone;

determining the second characteristic of the baseband signal at the second test tone frequency of the second test tone; and determining the characteristic of the radar reception path based on the first characteristic of the baseband signal and the second characteristic of the baseband signal.

5. The method as claimed in claim 1, wherein: the test signal has a discontinuous frequency spectrum, and a bandwidth of the first test tone is smaller than a bandwidth of the passband.

6. The method as claimed in claim 1, wherein the second test tone frequency of the second test tone is chosen such that the second characteristic that can be expected for the baseband signal at the second test tone frequency of the second test tone according to a transfer function of the downstream signal processing circuit is in a predetermined range.

7. The method as claimed in claim 1, wherein the second test tone frequency of the second test tone corresponds to a prescribed cutoff frequency from which there is provision to attenuate signal components in the baseband signal by a predetermined attenuation in comparison with the passband.

8. The method as claimed in claim 1, wherein the first test tone frequency of the first test tone corresponds to an envisaged cutoff frequency of the passband.

9. A radar apparatus, comprising:
a radar reception path, wherein the radar reception path comprises a mixer and a downstream signal processing circuit;

an injection circuit configured to inject a test signal into the radar reception path so that at least a first test tone having a first test tone frequency in a passband of the downstream signal processing circuit and a second test tone having a second test tone frequency outside the passband are present on the radar reception path downstream of the mixer; and an evaluation circuit configured to determine a characteristic of the radar reception path based on a first characteristic of a baseband signal of the radar reception path at the first test tone frequency of the first test tone and a second characteristic of the baseband signal of the radar reception path at the second test tone frequency of the second test tone.

10. The radar apparatus as claimed in claim 9, wherein the evaluation circuit is configured to:
determine the first characteristic of the baseband signal at the first test tone frequency of the first test tone;

determine the second characteristic of the baseband signal at the second test tone frequency of the second test tone; and determine the characteristic of the radar reception path based on the first characteristic of the baseband signal or the second characteristic of the baseband signal.

11. A method for determining a linearity characteristic of a radar reception path, wherein the radar reception path comprises a mixer and a downstream signal processing circuit, the method comprising:

injecting a test signal into the radar reception path so that at least a first test tone having a first test tone frequency in a passband of the downstream signal processing circuit and a second test tone having a second test tone frequency outside the passband are present on the radar reception path; and determining a linearity characteristic of the radar reception path based on characteristics of a baseband signal at harmonic frequencies of the first test tone and the second test tone.

12. The method as claimed in claim 11, further comprising:
determining amplitudes of the baseband signal at the harmonic frequencies of the first test tone and the second test tone; and determining the linearity characteristic of the radar reception path based on the amplitudes of the baseband signal at the harmonic frequencies of the first test tone and the second test tone.

13. The method as claimed in claim 11, further comprising:
generating the test signal for the mixer by mixing the first test tone and the second test tone with an oscillation signal, wherein injecting of the test signal into the radar reception path comprises applying the test signal to a signal input of the mixer.

14. The method as claimed in claim 11, wherein injecting of the test signal into the radar reception path is effected downstream of the mixer.

15. A radar apparatus, comprising:
a radar reception path, wherein the radar reception path comprises a mixer and a downstream signal processing circuit;

an injection circuit configured to inject a test signal into the radar reception path so that at least a first test tone having a first test tone frequency in a passband of the downstream signal processing circuit and a second test tone having a second test tone frequency outside the passband are present on the radar reception path downstream of the mixer; and an evaluation circuit configured to determine a linearity of the radar reception path based on characteristics of a baseband signal of the radar reception path at harmonic frequencies of the first test tone and the second test tone.

16. The radar apparatus as claimed in claim 15, wherein the evaluation circuit is configured to determine amplitudes of the baseband signal at the harmonic frequencies of the first test tone and the second test tone and determine the linearity characteristic of the radar reception path based on the amplitudes of the baseband signal at the harmonic frequencies of the first test tone and the second test tone.

17. The radar apparatus as claimed in claim 15, wherein the test signal has a discontinuity in a frequency spectrum between a first signal component that produces the first test tone of the test signal and a second signal component that produces the second test tone of the test signal.

* * * * *